(12) United States Patent
Lasich

(10) Patent No.: US 11,594,651 B2
(45) Date of Patent: Feb. 28, 2023

(54) CELL MODULE

(71) Applicant: Raygen Resources Pty Ltd, Malvern (AU)

(72) Inventor: John Beavis Lasich, Deepdene (AU)

(73) Assignee: RAYGEN RESOURCES PTY LTD, Malvern (AU)

( * ) Notice: Subject to any disclaimer, the term of this patent is extended or adjusted under 35 U.S.C. 154(b) by 0 days.

(21) Appl. No.: 16/601,138

(22) Filed: Oct. 14, 2019

(65) Prior Publication Data

US 2020/0044106 A1    Feb. 6, 2020

Related U.S. Application Data

(62) Division of application No. 14/768,269, filed as application No. PCT/AU2014/000125 on Feb. 14, 2014, now Pat. No. 10,483,420.

(30) Foreign Application Priority Data

Feb. 15, 2013    (AU) ................................ 2013900490

(51) Int. Cl.
*H01L 31/044*    (2014.01)
*H01L 31/05*    (2014.01)
(Continued)

(52) U.S. Cl.
CPC ...... *H01L 31/0508* (2013.01); *H01L 27/1421* (2013.01); *H01L 31/044* (2014.12);
(Continued)

(58) Field of Classification Search
CPC ....... H01L 31/00–078; Y02E 10/50–60; H02S 10/00–40; H02S 20/00–32; H02S 30/00–20; H02S 40/00–44
(Continued)

(56) References Cited

U.S. PATENT DOCUMENTS 4,040,867 A     8/1977  Forestieri et al.
4,481,378 A *  11/1984  Lesk ................. H01L 31/02021
                                                            257/443
(Continued)

FOREIGN PATENT DOCUMENTS

CN    201773167    *  3/2011
CN    202025782       11/2011
(Continued)

OTHER PUBLICATIONS

CN201773167 English translation (Year: 2011).*
(Continued)

*Primary Examiner* — Bach T Dinh
(74) *Attorney, Agent, or Firm* — Barnes & Thornburg LLP; G. Peter Nichols

(57) ABSTRACT

A photovoltaic cell assembly suitable for use in a dense array concentrated photovoltaic cell module includes a plurality of photovoltaic cells mounted on a substrate and a by-pass diode associated with each cell to allow the cell to be by-passed in the electrical circuit in the event that the cell fails or has low illumination. The diodes are positioned in the shadows of the cells. The diodes provide direct pathways for heat and electricity from the cells to the substrate.

11 Claims, 11 Drawing Sheets

(51) Int. Cl.
*H02S 40/42* (2014.01)
*H01L 31/048* (2014.01)
*H01L 27/142* (2014.01)
*H01L 31/0443* (2014.01)

(52) U.S. Cl.
CPC ........ *H01L 31/048* (2013.01); *H01L 31/0443* (2014.12); *H02S 40/425* (2014.12); *Y02E 10/50* (2013.01)

(58) Field of Classification Search
USPC ................................................ 136/243–265
See application file for complete search history.

(56) References Cited

U.S. PATENT DOCUMENTS

| | | | | |
|---|---|---|---|---|
| 5,330,583 | A * | 7/1994 | Asai | H01L 31/0504 136/251 |
| 5,616,185 | A * | 4/1997 | Kukulka | H01L 31/0352 136/244 |
| 6,232,545 | B1 | 5/2001 | Samaras et al. | |
| 2007/0295381 | A1 * | 12/2007 | Fujii | H01L 31/0224 136/244 |
| 2009/0025778 | A1 * | 1/2009 | Rubin | H01L 31/0512 136/246 |
| 2010/0236603 | A1 | 9/2010 | Menard et al. | |
| 2010/0319754 | A1 | 12/2010 | Sajjad et al. | |
| 2010/0326492 | A1 * | 12/2010 | Tan | H01L 31/052 136/246 |
| 2011/0132431 | A1 * | 6/2011 | Linderman | H01L 27/1421 136/246 |
| 2012/0298166 | A1 | 11/2012 | Chen et al. | |
| 2013/0306130 | A1 * | 11/2013 | Reichstetter | H01L 31/0488 136/246 |

FOREIGN PATENT DOCUMENTS

| | | |
|---|---|---|
| CN | 102388464 | 3/2012 |
| JP | H10-163511 | 6/1998 |

OTHER PUBLICATIONS

U.S. Appl. No. 14/768,269, filed Aug. 17, 2015.
PCT/AU2014/000125 International Search Report dated Mar. 1, 2014 (4 pages).

* cited by examiner

CELL MODULE

The present invention relates to a photovoltaic cell module.

The present invention relates particularly to a photovoltaic cell module that includes a photovoltaic cell assembly that includes an array of photovoltaic cells that are connected together as a series circuit and is used in a concentrated solar radiation-based electrical power generating system. The present invention is described hereinafter, by way of example, in the context of this application but is not limited to this application.

Solar radiation-based electrical power generating systems typically include:

(a) a receiver that includes an array of photovoltaic cells for converting solar energy into electrical energy, and (b) a concentrator for concentrating solar radiation onto the photovoltaic cells of the receiver.

More particularly, the present invention provides a photovoltaic cell module for a receiver of a solar radiation-based electrical power generating system comprising:

(a) a photovoltaic cell assembly that includes at least one photovoltaic cell having an exposed surface for solar radiation;

(b) an electrical connection for transferring an electrical energy output of the photovoltaic cell assembly to an output electrical circuit, and (c) an assembly for extracting heat from the photovoltaic cell, the assembly comprising a coolant chamber positioned behind the exposed surface of the photovoltaic cell assembly having a coolant inlet and a coolant outlet for coolant to be supplied into the chamber and for heated coolant to be removed from the chamber.

More particularly, the present invention relates to a photovoltaic cell assembly for a photovoltaic cell module.

More particularly, the present invention relates to a dense array concentrated photovoltaic cell module and to a photovoltaic cell assembly for the module. The term "dense array concentrated photovoltaic cell module", hereinafter referred to a dense array CPV module, is understood herein to mean a close packed array of photovoltaic cells that have an exposed surface area that can receive solar radiation directly onto the cells of at least 90% of the total exposed surface area of the module. Typically at least 95%, more typically at least 97%, and more typically again at least 98% of the total exposed surface area of the module.

The present invention is applicable particularly, although by no means exclusively, to large scale solar radiation-based electrical power generating systems of the type described above that are capable of producing substantial amounts of electrical power ready for conditioning to at least 20 kW of standard 3 phase 415 volt AC power.

End-use applications for such large scale power generating systems include remote area power supply for isolated grids, mains grid-connected power, water pumping, telecommunications, crude oil pumping, water purification, and hydrogen generation.

BACKGROUND

One significant issue associated with the development of commercially viable solar radiation-based electrical power generating systems of the type described above is energy conversion efficiency.

Energy conversion efficiency is a very strong driver of the economics of solar power systems. When a conversion efficiency increase can be achieved at a percentage system cost increase which is less than the percentage efficiency increase, the commercial prospects for the solar power system are improved.

Current indications are that the present invention can achieve an efficiency increase of the order of 5% at a system cost increase of less than 0.5%.

Two issues that have a negative impact on energy conversion efficiency in a solar radiation receiver are (a) dead space and (b) flux variation.

The issue of dead space relates to the ratio of active photovoltaic cell area versus the total module area. This ratio is the Active Cell Area Ratio (ACAR). Dense array systems known to the applicant typically have ACARs of only 65% to 95%.

Challenges that have limited the ACARs of prior art arrangements known to the applicant include:

(a) a space limitation and complexity of interconnection of adjacent photovoltaic cells to form a circuit;

(b) the 'bus bar' connection on the top of cells causing shading of the cells and reducing the effective active area;

(c) the diode connection; and.

(d) the area occupied by an edge seal which provides for safety and reliability

The issue of flux variation relates to the arrangement and characteristics of the cells and modules in a receiver (including cell size and connections between cells) and to the flux distribution impinging on the receiver relating to the collectors for reflecting solar radiation to the receiver. The variation in flux can also be time-based and, typically, is a more significant issue with collectors that reflect and concentrate solar radiation, such as heliostat-based concentration systems.

The applicant has considered the issues of dead space and flux variation in relation to dense array CPV module design.

The applicant decided that it is desirable to have a module that has a high ACAR and a high voltage. The high ACAR results in high conversion efficiency in a module because of the greater percentage of active cell area exposed to radiation for a given module size. This is a driver for larger cells with a minimum number of connectors, diodes and a small edge seal. High voltage allows maximum parallel connections of modules, which results in high average module efficiency across a receiver which has a plurality of modules subject to variable flux. This is a driver for smaller cells. These issues are therefore are opposing issues.

Known photovoltaic cells which are used in dense array CPV modules are typically low voltage (0.5 to 6 V). Thus, many cells must be connected in series to achieve a desirable high voltage (typically 200 to 1000 V). This means the cells must be relatively small and there are many connections in the module. This means the connections must consume a minimum of (active area) module space, otherwise the advantage gained will be lost due to the dead space taken up by the increased number of connections.

The many hundreds of cells and connections must also be very reliable or have a means to bypass a failed cell or connection so that the effect due to its failure is minimised.

It has been proposed in the non-patent literature to use a "shingle" arrangement of a string of photovoltaic cells in a module rather than a more standard end-to-end arrangement of cells. The proposed prior art shingle arrangement includes a leading edge of one photovoltaic cell overlapping a trailing edge of a successive cell in a short straight string of cells, to cover an inactive "bus bar" area of these successive cells. The proposed prior art shingle arrangement potentially results in a high ACAR in view of the cell overlap with resultant bad heat transfer.

The applicant has found in research and development work that when cells are appropriately mounted, the shingle approach may be practical for a single short straight length string of cells but may not be a solution for large scale solar radiation-based electrical power generating systems which require large areas of a large number of active cells to be interconnected in one or more lines of cells in order to achieve a required module voltage.

More specifically, limitations/challenges of the known shingle arrangement approach that have been identified by the applicant include:

(a) low voltage due to short string length, (b) low power due to short string length, (c) high mechanical strain due to the monolithic nature of overlapping arrangement effectively increasing size of the cell physical structure in one direction, (d) poor heat transfer due to limited contact of sloped cell with a cooled substrate (such as a copper pad) to which it is usually attached, (e) difficulties changing direction of a string; and.

(f) cost of interconnects and or modified cells (for non-shingle arrangements).

In summary, there is a need for a shingle arrangement that includes bypass diodes and a simple "cross" connection so that a low strain serpentine string can cover a 2 dimensional array with minimal dead space and excellent heat transfer to minimise cell temperature for use in concentrated light. In more general terms, not confined to shingle arrangements, there is a need for an alternative photovoltaic cell assembly that is suitable for use in a dense array CPV module to the currently available assemblies.

The above description is not to be taken as an admission of the common general knowledge in Australia or elsewhere.

SUMMARY

The applicant has realized after considering the results of research and development work that in order to optimize the shingle arrangement approach for string cell module design to a practical level, (a) many short straight strings of cells must be interconnected and the thermal connection between the cells and a cooled substrate that supports the cells in a module must be maintained and (b) bypass diodes are required in any string arrangement of cells, whether the string be a shingle arrangement or an end-to-end (co-planar) arrangement of cells to allow the module to continue to function in the event that there is a failure of one or more than one of the photovoltaic cells in a module, (c) in a dense array CPV module this interconnection of cells must be achieved with minimal "dead space", (d) and an edge seal is required which is substantial enough to provide weather protection for the cells and meet safety requirements and also cause minimum dead space.

In broad terms, the present invention provides a photovoltaic cell assembly suitable for use in a dense array concentrated photovoltaic cell module includes a plurality of photovoltaic cells mounted on a substrate and a by-pass diode associated with each cell to allow the cell to be by-passed in the electrical circuit in the event that the cell fails or has low illumination. The diodes are positioned in the shadows of the cells. The diodes provide direct pathways for heat and electricity from the cells to the substrate.

In broad terms, the present invention provides a photovoltaic cell assembly that is suitable for use in a dense array concentrated photovoltaic cell module, the assembly including a plurality of photovoltaic cells mounted on a substrate, each cell having an exposed surface for acceptance of solar radiation, the cells being arranged in a dense array that includes at least one string of cells which are electrically connected together and form a series electrical circuit, and each string including a plurality of straight lengths of cells that form rows, with the end cell of one row of cells being electrically connected to the cell at the beginning of a successive row of cells, and a by-pass diode associated with each cell to allow the cell to be by-passed in the electrical circuit in the event that the cell fails or has low illumination, the diodes being positioned in the shadows of the cells, and the diodes providing direct pathways for heat and electricity from the cells to the substrate.

One terminal of each diode may be directly in contact electrically and thermally with the substrate and the other terminal of each diode may be directly in contact electrically and thermally with the neighbouring cell.

The dense array may cover more than 95% of the assembly with active cell area.

The substrate may include a plurality of metallised elements that form mounting pads for cells, each cell being mounted on one of the metallised elements, each metallised element including a section that extends under a neighbouring (such as a preceding) cell in the electrical circuit, the bypass diode for the cell being positioned beneath and in the shadow of the preceding cell and mounted on the section of the metallised element that extends under the neighbouring cell, the diode being electrically and thermally connected to the substrate via the section of the metallised element, and the diode being electrically connected to the neighbouring cell.

When the diode is electrically and thermally connected to the substrate via the section of the metallised element and the diode is electrically connected to the neighbouring cell, it follows that the terminals of the diode are spaced apart with one terminal being closer to the cell than the other terminal.

The above-described position of the diode means that no other components are required to connect the by-pass diode to form a by-pass circuit for the cell.

The cells may be mounted to the substrate in a shingle arrangement.

The contours of the metalised elements may follow the profile of the underside of the shingled cells such that at least 90%, typically 95%, of each cell is maintained in thermal contact with the substrate.

The three dimensionality of the metallised zone/substrate due to the shingle arrangement provides space for locating the diode under the neighbouring cell, while allowing the cells to be positioned in the densely packed array.

The metallised elements may have an inclined upper surface that mounts the cells at an angle to the substrate so as to allow overlapping of the cells to form the shingle arrangement.

Typically, the metallised elements are 100 microns high at one end.

Typically, the metallised elements are 400 microns high at the other end.

The metallised elements may form a saw tooth profile when viewed in cross-section through the cell along a row of cells.

The metallised elements may be electrically separated from each other.

The section of the metallised element that extends under the preceding cell may be in the form of a tongue.

The aspect ratio of the width to the height of each diode may be 5:1 to 10:1. The aspect ratio facilitates the electrical connection to the associated cells.

The entire one side of the by-pass diode may be connected to the substrate, thereby maximising heat transfer to the substrate.

The diode may be made of silicon or other high thermal conductivity material.

The substrate may be an electrical insulator and a thermal conductor.

The substrate may be a ceramic material.

The substrate may be aluminium nitride or silicon nitride.

The cells may be soldered to the metallised elements.

The metallised elements may be directly bonded to the substrate.

The assembly may include a cross-connection element that electrically connects together the end of one row and the beginning of a successive row of cells.

The cross-connect element may be in the form of a simple flat strip since the shingle array allows for connection of the top of the previous cell to the bottom of the next cell to be done in a single plane.

The cross-connect element may be a ribbon or a strip of metal.

The metal may be any suitable metal, such as silver.

The assembly may include an edge seal.

The area occupied by the edge seal may be less than 4% of the total module area.

There is a minimum thickness for an edge seal to be effective, and in order to maximise ACAR it is necessary to minimise the dead space occupied by the edge seal. The module should thus be large enough to minimise the percentage covered by the edge seal. There is a practical limit the size of a module, mostly because of manufacturing yield.

For a module of at least 100 mm by 100 mm, an edge seal of up to 1 mm, which is a substantial, will give rise to less than 4% dead space.

The assembly may comprise electrical input and output terminals at the perimeter of the assembly.

In situations where the photovoltaic cell assembly is other than a shingle arrangement, the present invention also provides a photovoltaic cell assembly that is suitable for use in a dense array concentrated photovoltaic cell module, the assembly including a plurality of photovoltaic cells mounted on a substrate, each cell having an exposed surface for receiving solar radiation, the cells being arranged in a dense array that includes at least one string of cells which are electrically connected together and form a series electrical circuit and being physically arranged, a by-pass diode associated with each cell to allow the cell to be isolated from the electrical circuit in the event that the cell fails, and the diodes being positioned in the shadows of the cells, and a Z-shaped connection electrically connecting together successive cells, the Z-shaped connection having a pair of spaced-apart parallel arms and an interconnecting web, with the lower arm of each connector being connected to an under surface of a leading end of one cell and the upper arm of each connector being connected to an upper surface of a trailing end of a successive cell, and the bypass diode of the successive cell being located below the one cell and being connected to the lower arm of the connector, the assembly thereby connecting successive cells in series and simultaneously providing parallel connection to the diode with the successive cell, thereby protecting that cell.

This arrangement allows an appropriate positioning of the diodes below the cells and also provides the parallel connection of the diode. This placement of the diodes below the cells also makes it possible to maximize the ACAR (active area ratio).

The length of the rows of the dense array of cells is set such that the mechanical strain is held to within practical limits, while allowing maximum voltage.

The present invention also provides a dense array concentrated photovoltaic cell module that includes a plurality of the photovoltaic cell assemblies described above stacked together in side by side relationship in an array to form a receiver where the module area of the module area is greater than 95% of the array area.

The present invention also provides a method of manufacturing a substrate for a shingle arrangement of the above-described photovoltaic cell assembly includes the following steps:

etching a piece of a metal-coated ceramic material to create required gaps in the metal layer on one side of the piece, thereby leaving metal pads for mounting cells in a serpentine arrangement on that side of the piece;

machining the surface of the metal pads to form metallised elements that are adapted to function as mounting pads having a required sawtooth profile to mount cells (typically 100 microns high at one end and typically 400 microns high at the other end); and completing the manufacture of the substrate by applying a constant thickness of solder (typically 50-100 microns) or other suitable bonding medium, for example by screen printing, to the metallised elements.

BRIEF DESCRIPTION OF THE DRAWINGS

The present invention is described further by way of example only with reference to the accompanying drawings of which.

DESCRIPTION

The invention is a photovoltaic cell assembly that is suitable for use in a "stackable" dense array CPV module.

Each of the embodiments of the photovoltaic cell assembly of the invention shown in FIGS. 1 to 17, include a plurality of photovoltaic cells arranged in a string of cells in a shingle arrangement and forming a 2 dimensional array of rows of cells interconnected at the ends of the rows, with the assembly having a high percentage of active area, a bypass diode for every cell, minimum mechanical strain for the cells, a long enough string of cells to provide a sufficiently high voltage to allow optimal parallel connection of the strings, and an effective edge seal which occupies a low percentage of the total module area.

Figure 18:
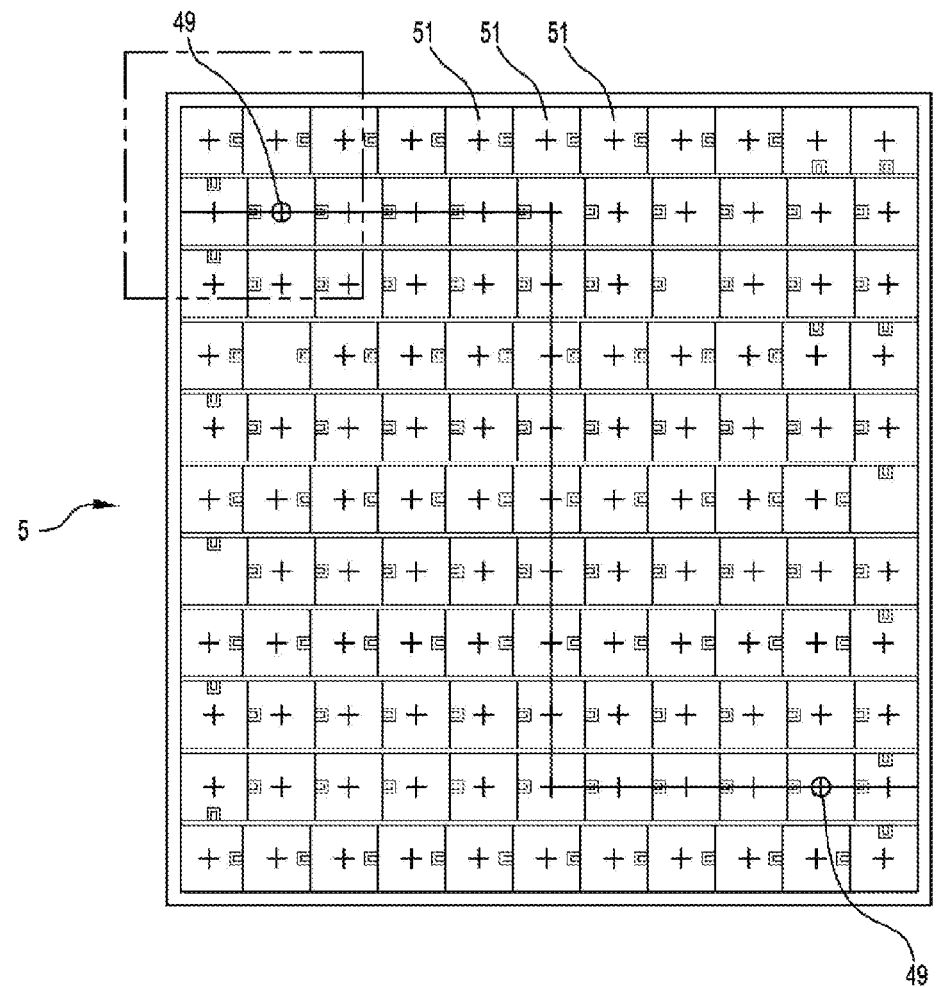
FIG. 18 is a top plan view of another embodiment of a dense array concentrated photovoltaic cell module in accordance with the present invention that is suitable for use in a receiver of a solar radiation-based electric power generating system, with the module including another embodiment of a photovoltaic cell assembly in accordance with the present invention, with the top cover and the photovoltaic cells removed to reveal the layout of the upper metalized layer of the substrate of the assembly.
Figure 19:
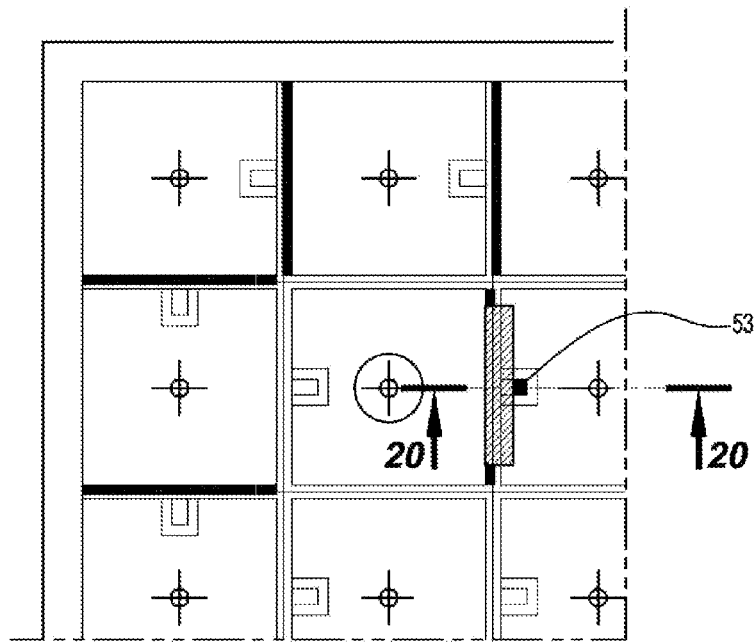
FIG. 19 is an enlargement of the rectangular box referred to as "Detail A" in FIG. 18.
Figure 20:
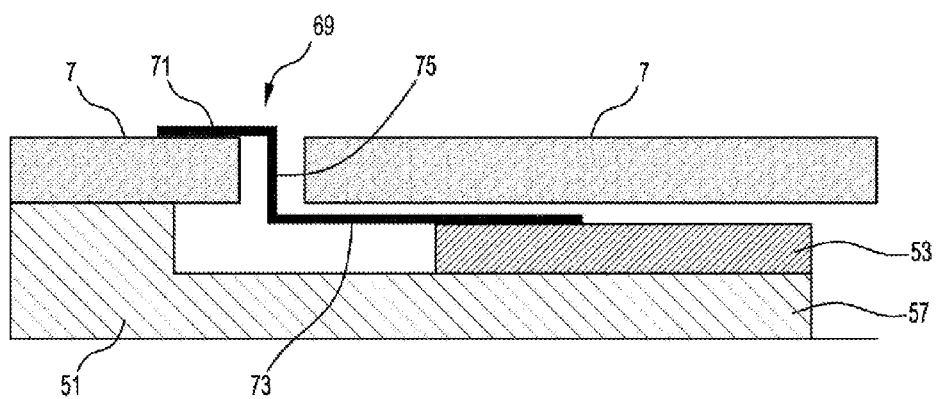
FIG. 20 is a cross-section along the line 20-20 in FIG. 19.

The embodiment of the present invention shown in FIGS. 18 to 20, which is not the only other embodiment of the invention, is not a shingle arrangement but relies on Z-connections between successive cells arranged in a string and otherwise has the above-described features of the FIGS. 1 to 17 embodiments.

The embodiments of the photovoltaic cell assembly of the invention can achieve an ACAR approaching 100% for a module with a cost reduction due to the elimination of most of the complicated interconnections or the need to use modified cells which cost more. More particularly, the embodiments of the photovoltaic cell assembly of the present invention have sufficient cells and attendant connections between cells to produce a high total voltage, and individual diode protection for every cell and the connections between cells, while minimizing the loss of active area in the dense array CPV module, i.e. a maximised ACAR. When such a module is "stacked" in a 2 dimensional array to form a receiver the overall active area may be greater than 95%.

The opportunity for connection protection via the by-pass diode arrangement of the embodiments of the photovoltaic cell assembly of the invention is a significant feature of the invention and is a feature that is not confined to shingle arrangements of cells. Dense array CPV modules of the present invention can output full receiver voltage and can be connected in parallel with other dense array CPV modules in an array and eliminate most of the power loss due to a series connection of dense array CPV modules with different levels of illumination (the output of each module in a string is typically limited to the power of the lowest module in a string).

Figure 1:
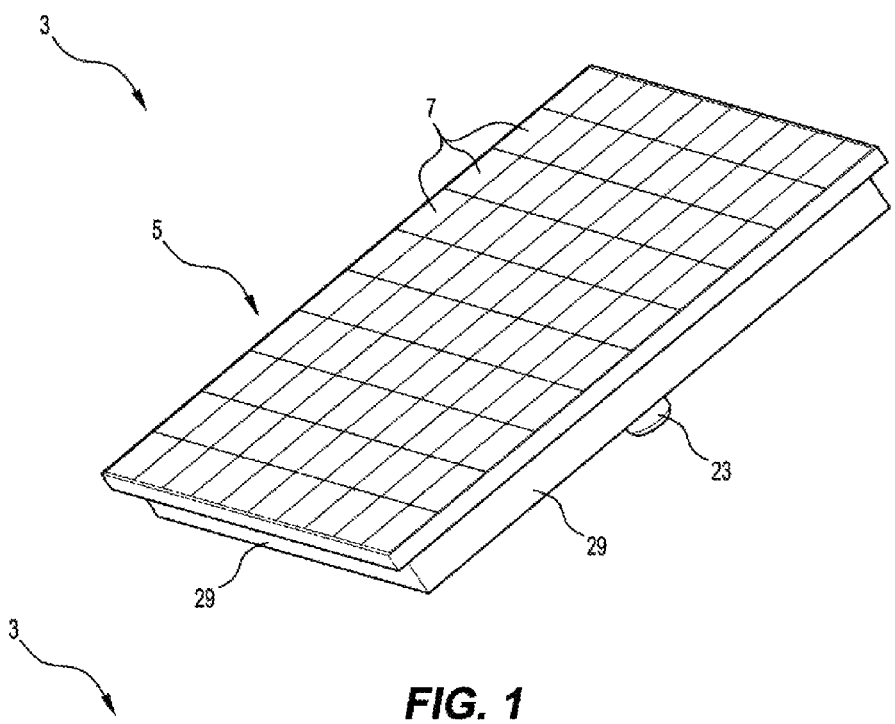
FIG. 1 is a perspective view of one embodiment of a dense array concentrated photovoltaic cell module in accordance with the present invention that is suitable for use in a receiver of a solar radiation-based electric power generating system, with the module including one embodiment of a photovoltaic cell assembly in accordance with the present invention.
Figure 2:
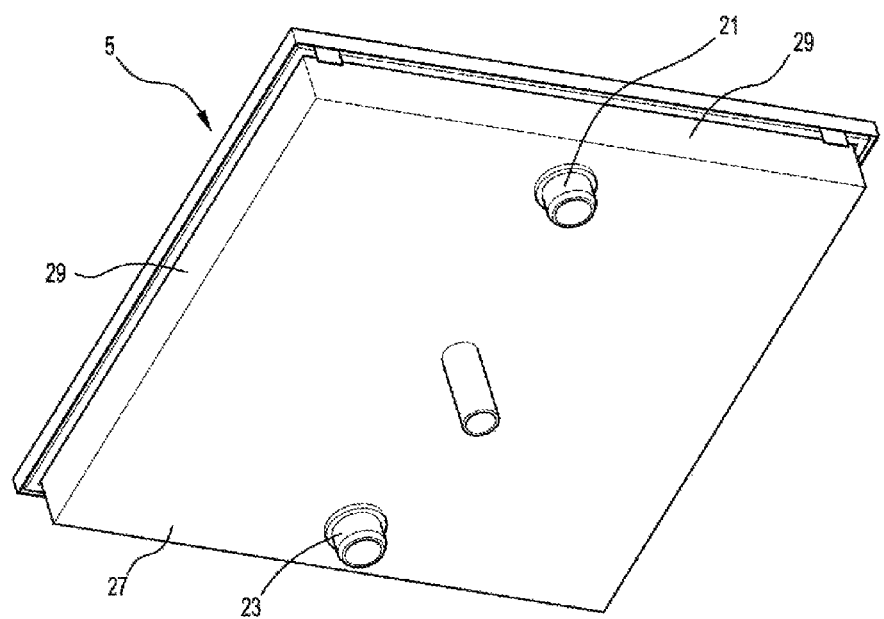
FIG. 2 is another perspective view of the module shown in FIG. 1.
Figure 3:
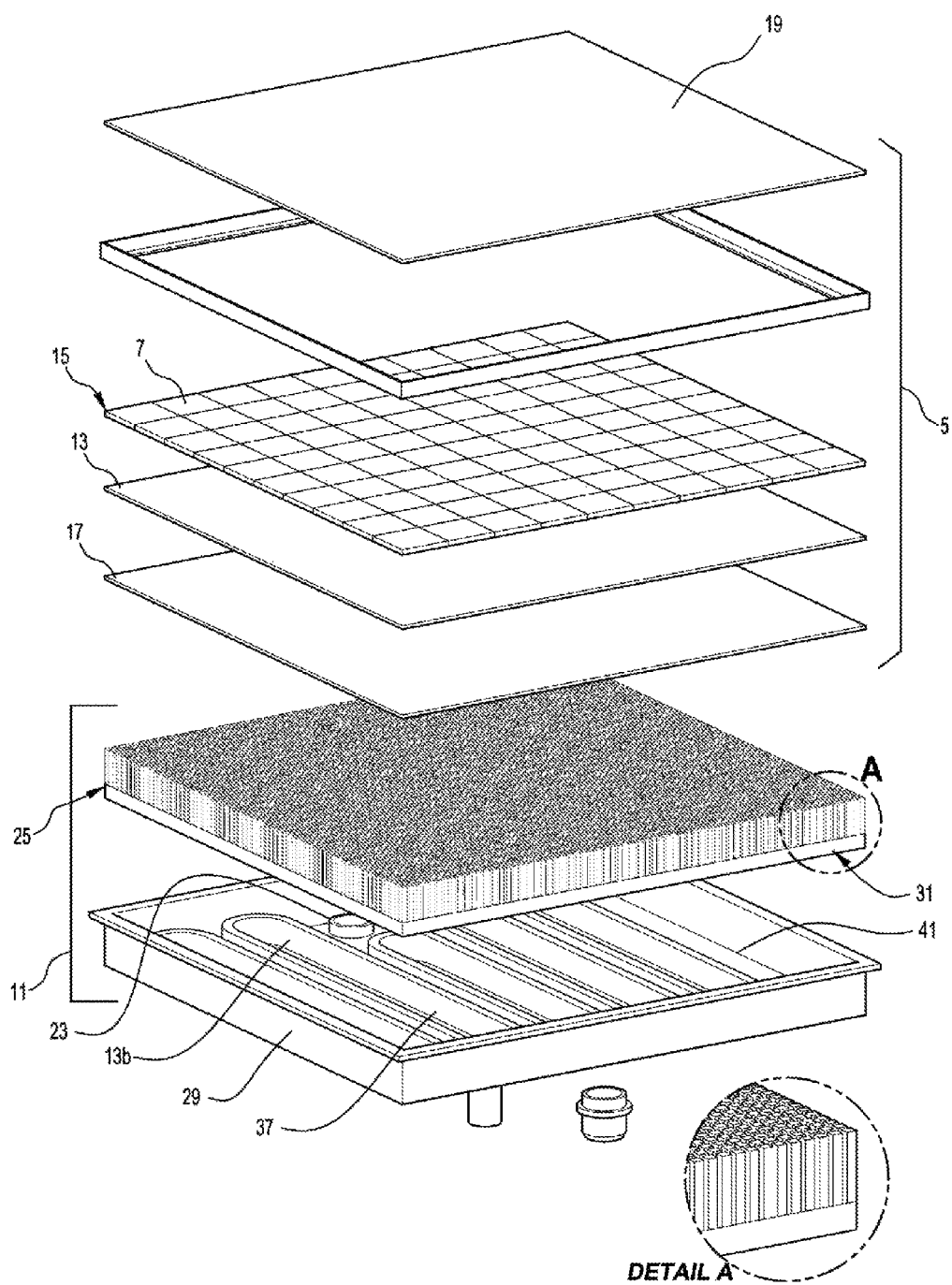
FIG. 3 is an exploded view of the module shown in FIGS. 1 and 2 which illustrates the components of the module, including the embodiment of the photovoltaic cell assembly.

FIGS. 1 to 3 show an embodiment of a module 3 that is suitable for use in a solar radiation-based electric power generating system.

By way of example, such a system includes a solar radiation concentrator in the form of a concentrating array of mirrors (not shown) that reflects solar radiation that is incident on the mirrors towards a solar radiation receiver (not shown) in the form of a plurality of photovoltaic cells that are arranged in modules. An electrical circuit (not shown) transfers the electrical energy output of the photovoltaic cells to an inverter for end-use application of the electrical energy. End-use applications include remote area power supply for isolated grids, mains grid-connected power, water pumping, telecommunications, crude oil pumping, water purification, and hydrogen generation.

The receiver may be the receiver that is described and claimed in International application PCT/AU2011/001245 entitled "Receiver" in the name of the applicant. The disclosure in the specification of the International application is incorporated herein by cross-reference.

The embodiment of the module 3 shown in FIGS. 1 to 3 is described and claimed in International application PCT/AU2011/001246 entitled "Cell Module" in the name of the applicant. The disclosure in the specification of the International application is incorporated herein by cross-reference.

With reference to FIGS. 1 to 3, the module 3 includes:

(a) a photovoltaic cell assembly generally identified by the numeral 5 that includes a plurality of photovoltaic cells 7 (FIGS. 1 and 3) having an exposed surface for acceptance of solar radiation;

(b) electrical connections 49 (not shown in these Figures but shown in other Figures such as FIGS. 6 and 8) for transferring electrical energy output of the photovoltaic cell assembly 5 to an output electrical circuit (not shown), (c) an assembly generally identified by the numeral 11 (FIGS. 1 and 3) for extracting heat from the photovoltaic cell;

(d) a control system (not shown) for controlling the system; and (e) a monitoring system (not shown) for monitoring the condition of components of the system.

The electrical connections 49 for the module 3 are in the form of electrical leads (see FIGS. 6 and 8) that extend through an opening (not shown) in the module 3.

The control system and the monitoring system may be any suitable systems. The selection of these systems is not a key consideration in relation to the invention.

The heat extraction assembly 11 comprises a coolant chamber 41 positioned behind the exposed surface of the photovoltaic cell assembly 5. The coolant chamber 41 has a coolant inlet 21 and a coolant outlet 23 for coolant (typically water) to be supplied into the chamber 41 and for heated coolant to be removed from the chamber 41. The coolant chamber 41 is defined by (a) a housing that comprises a base 27 and side walls 29 extending from the base 27 and (b) the photovoltaic cell assembly 5 connected to upper ends of the side walls 29 of the housing.

The photovoltaic cell assembly 5 comprises a support substrate on which the photovoltaic cells 7 are secured. As can best be seen in FIG. 3, the substrate is a multiple layer substrate that includes (a) a layer 13 of an electrical insulation material, such as a ceramic material and (b) top and bottom metalized layers 15 and 17 respectively of a metal or a metal-containing material on opposite top and bottom faces of the electrical insulation material layer 13 and (c) an optically suitable protective glass top cover 19 that is on the photovoltaic cells 7. The layers 13, 15, 17 of the substrate are secured together by any suitable means.

The photovoltaic cells 7 are secured (for example thermally and electrically bonded) to the metalized layer 15 of the substrate. The other metalized layer 17 of the substrate is secured (for example thermally bonded) to the heat extraction assembly 11.

Figure 4:
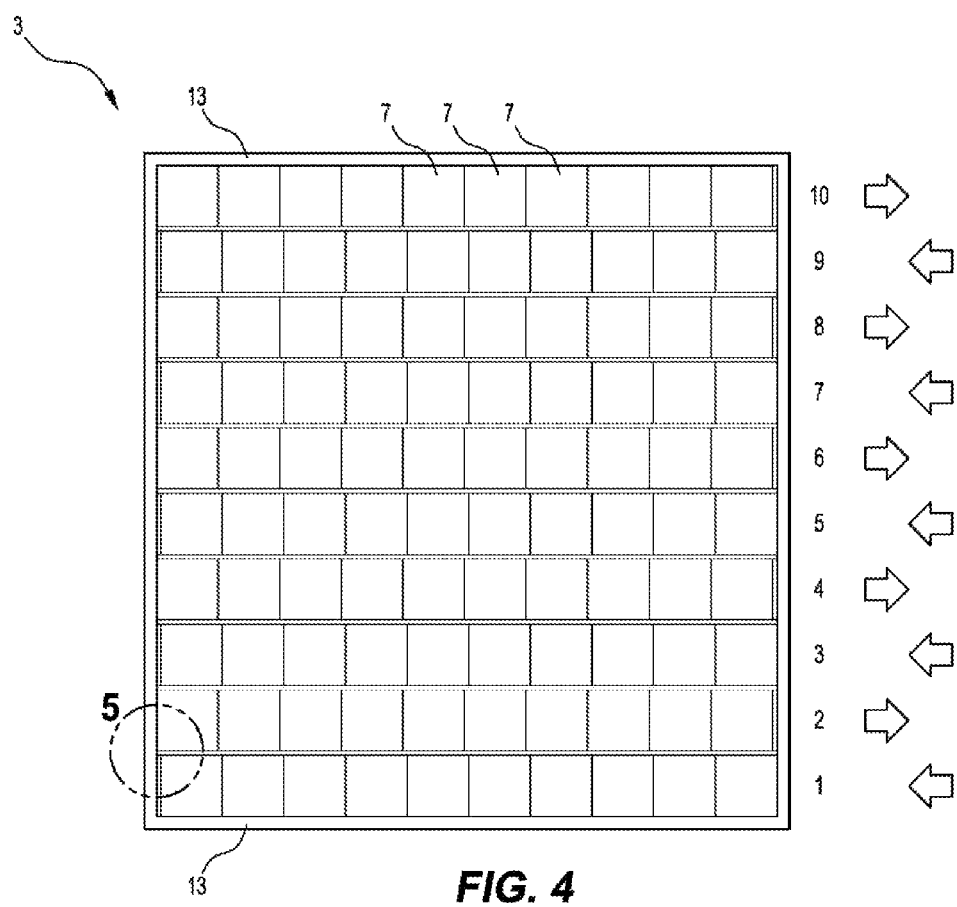
FIG. 4 is a top plan view of the photovoltaic assembly of the dense array concentrated photovoltaic cell module shown in FIGS. 1 to 3.
Figure 5:
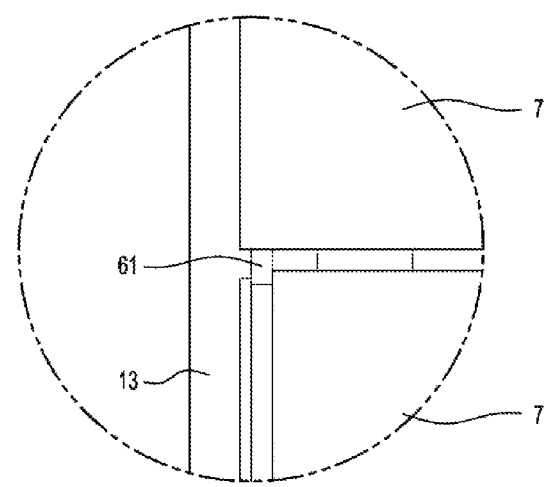
FIG. 5 is an enlarged top plan view of the circled area of FIG. 4.
Figure 6:
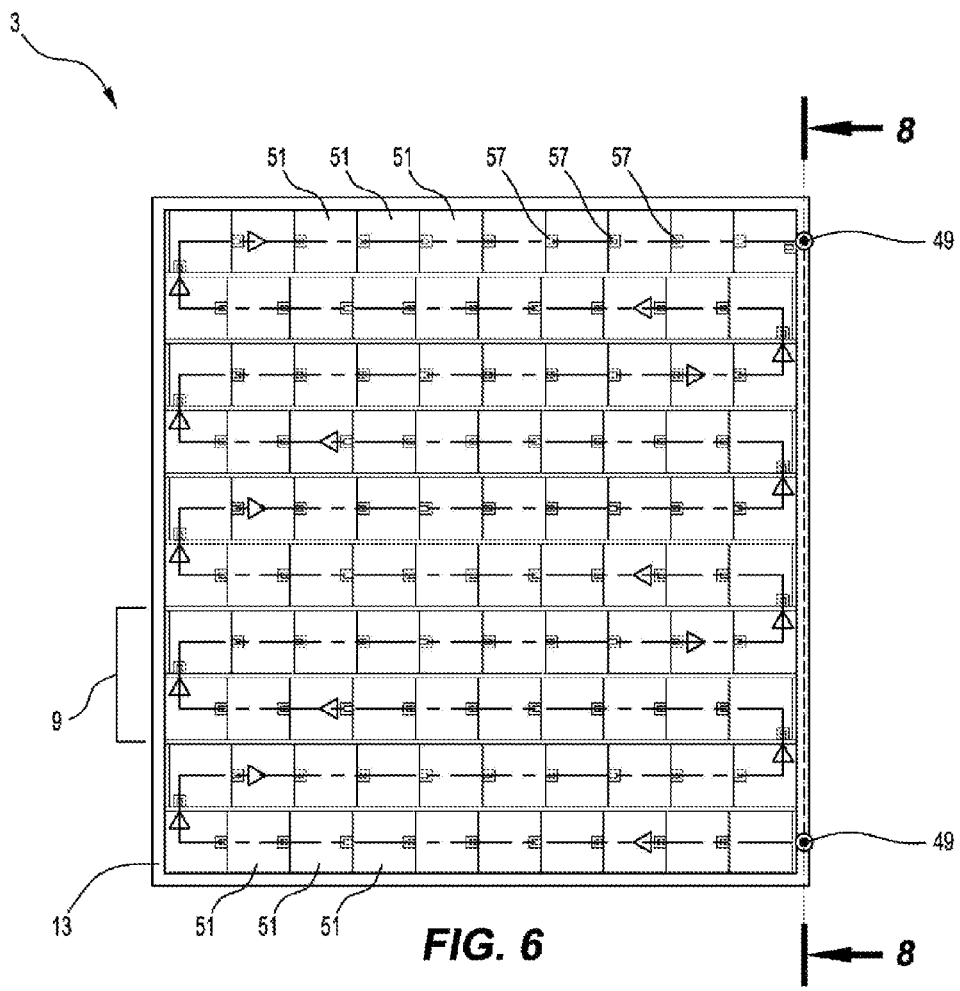
FIG. 6 is top plan view of FIG. 4, with the top cover and the photovoltaic cells of the photovoltaic assembly removed to reveal the layout of the upper metalized layer of the substrate of the assembly.
Figure 8:
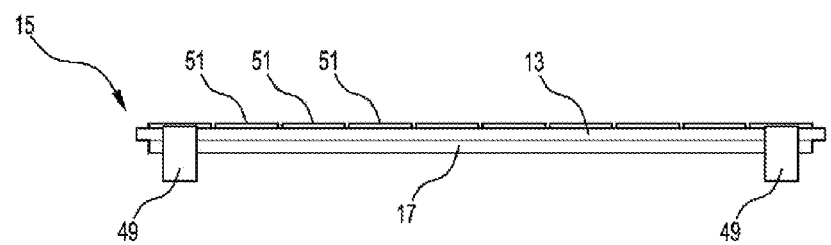
FIG. 8 is a cross-section along the line 8-8 of FIG. 6.

FIG. 4 is a top plan view of the photovoltaic assembly 5 of the module shown in FIGS. 1 to 3. FIG. 6 is the top plan view of the photovoltaic assembly 5 with the top cover 19 and the photovoltaic cells 7 removed to reveal the layout of the upper metalized layer 15 of the substrate of the assembly. FIGS. 5 and 6 and 8 to 12 show the assembly in more detail. FIGS. 9 to 12 include photovoltaic cells 7 positioned on the metallised layer 15.

As can best be seen in FIGS. 1 and 4, the cells 7 of the photovoltaic assembly 5 are arranged in a dense array that includes a string of cells 7 which are electrically connected together and form a series electrical circuit. The string includes a plurality of straight lengths of cells 7 that form rows, with the end cell of one row of cells being electrically connected to the cell at the start of a successive row of cells. The cells 7 in each row of cells are in a shingle pattern. The arrangement of the cells 7 may be described as a serpentine arrangement.

With reference to FIG. 6, the series electrical circuit runs from the terminal end of lead 49 at the bottom right corner of FIG. 6 along the first row to the end of that row on the bottom right corner of the Figure and across to the first cell 7 in the adjacent row (i.e. upwardly as viewed in the Figure) and along that row to the end of the row and across to the first cell 7 in the next row, and so on until the series circuit reaches the terminal end of the lead 49 at the top right corner of the Figure. The series circuit is indicated by the arrowed line in the Figure.

The upper metallised layer 15 of the substrate is formed to receive and support the cells 7 in the shingle pattern. With reference to FIGS. 4 and 6 to 11, the upper metallised layer 15 comprises a plurality of wedge-shaped mounting pads 51 in each row. The arrangement of the wedge-shaped mounting pads 51 in each row may be described as a sawtooth profile as viewed in the cross-section shown in FIG. 8. The mounting pads 51 are electrically separated from each other.

The mounting pads 51 are arranged so that the first mounting pad 41 in each row is formed so that the thin end of the wedge-shaped mounting pad 51 is at the start of the row. The mounting pads 51 are also arranged so that the last mounting pad 41 in each row is formed so that the thick end of the wedge-shaped mounting pad 51 is at the end of the row. This arrangement of the mounting pads 51 is evident from FIG. 12, which is a side view of the ends of two adjacent rows of cells 7. The other mounting pads 51 in each row are formed in the same alignment, i.e. with the thin end of the pad being the leading end and the thick end of each pad being the trailing end. This forms the saw-tooth profile mentioned above. It can be appreciated that with this arrangement the cells 7 are inclined upwardly along the length of each row, with the angle being determined by the angle of the wedge-shaped mounting pads 51. The angle is selected so that the cells 7 are arranged in overlapping relationship, with the trailing end of one cell 7 in each row overlapping the leading end of the next successive cell 7 in each row. Typically, the metallised elements are 100 microns high at one end. Typically, the metallised elements are 400 microns high at the other end.

Figure 9:
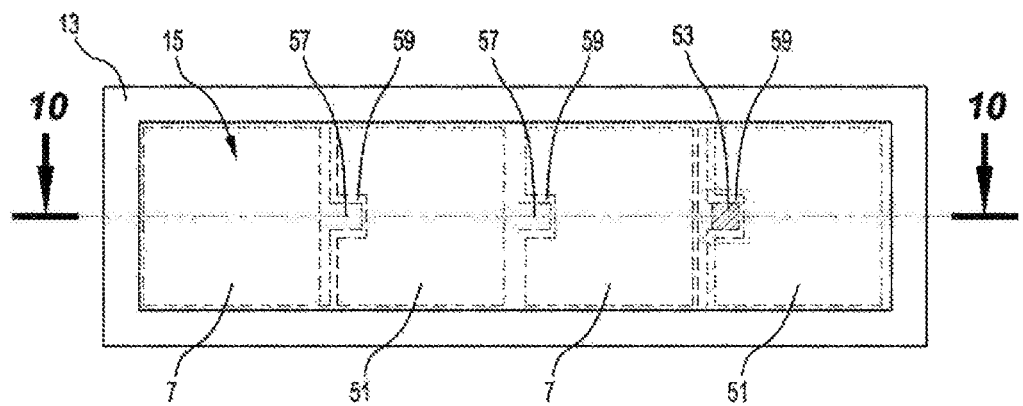
FIG. 9 is a top plan view of four of the sections of the upper metalized layer of the substrate of the assembly shown in FIG. 6, with photovoltaic cells positioned on the upper metallised layer.
Figure 10:
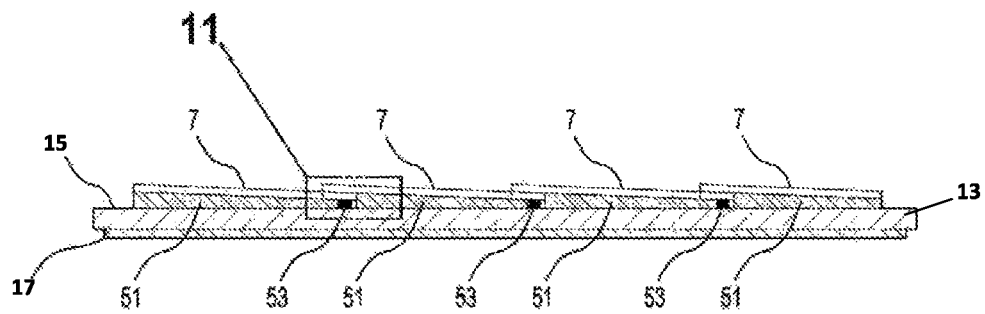
FIG. 10 is a cross-section along the line 10-10 of FIG. 9, which also includes the photovoltaic cells positioned on the upper metalized layer.

FIG. 9 shows four successive wedge-shaped mounting pads 51 that form part of one row of the upper metallised layer 15 of the substrate. The mounting pads 51 are shown in dotted outline. With reference to FIG. 9, each mounting pad 51 has a generally square shape, with a tongue 57 extending from a central section of a leading end of the pad 51 (i.e. on the right side of the pad 51 as viewed in the Figure) and a rebate 59 extending from a central section of a trailing end of the pad 51 (i.e. on the left of the pad as viewed in the Figure). It is clear from FIG. 9 that the mounting pads 51 are formed so that the tongues 57 extend into the rebates 59. The tongues 57 are sections of the mounting pads 51 that extend under a neighbouring (i.e. a preceding) cell in the electrical circuit.

The photovoltaic cell assembly 5 includes a silicon (or any other suitable) by-pass diode 53 associated with each cell 7 to allow the cell 7 to be by-passed in the electrical circuit in the event that the cell 7 fails or is under illuminated. As can best be seen in FIG. 11, the diodes 53 are positioned in the shadows of the cells 7. The diodes 53 provide direct pathways for heat and electricity from the cells 7 to the substrate. The shingle arrangement of the cells 7 provides space for locating the diode 53 associated with each cell 7 under the preceding cell 7, while allowing the cells 7 to be positioned in the densely packed array.

Figure 11:
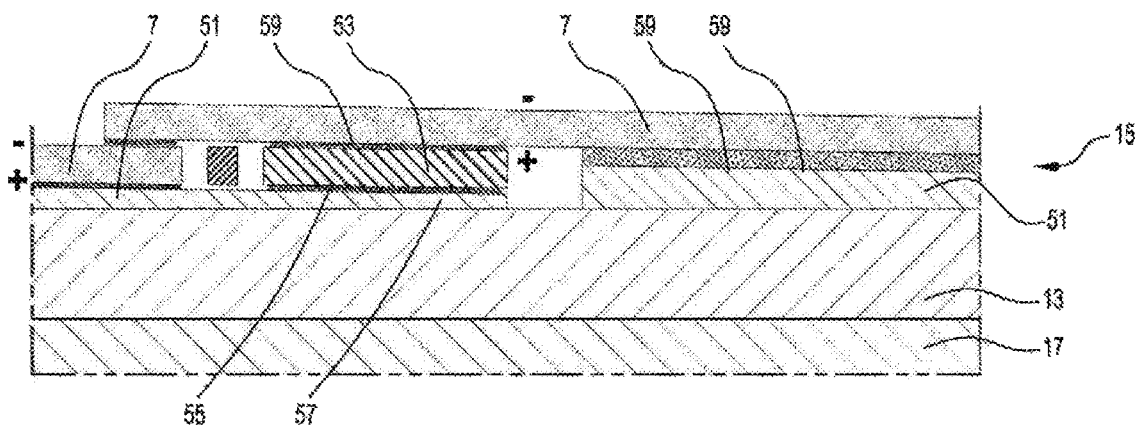
FIG. 11 is an enlargement of the rectangular box referred to as "Detail A" in FIG. 10.

Each diode 53 is positioned beneath and in the shadow of the preceding cell 7 and is mounted on the tongue 57 of the mounting pad 51 that extends under the preceding cell. The diode 53 is electrically and thermally connected to the substrate via the tongue 57 of the mounting pad 51. In addition, the diode 53 is electrically and thermally connected to the preceding cell 7. With reference to FIG. 11, one terminal 55 of each diode 53 is directly in contact electrically and thermally with the tongue 57 of the mounting pad 51 of the cell 7 with which the diode 53 is associated, and the other terminal 59 of each diode 53 is directly in contact electrically and thermally with the preceding cell 7, i.e. the cell 7 under which the diode 53 is located. With this arrangement, if there is a short circuit in a cell 7, the diode 53 associated with the diode forms a current path from the preceding cell 7 through the mounting pad 51 on which the short-circuited cell 7 is mounted to the next cell 7 in the row of cells. This arrangement also provides an effective cooling path through the thin highly thermally conductive diode and thus maintaining a low temperature for that portion of the cell which is connected to the top of the diode 53.

Figure 12:
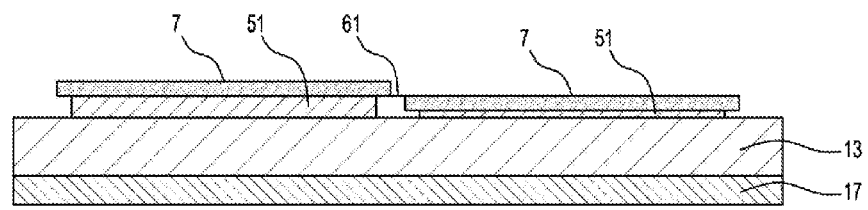
FIG. 12 is a side view of the ends of two adjacent rows of cells identified by the bracket "9" in FIG. 6 which illustrates the electrical cross-connection between the rows of photovoltaic cells at one end.

With reference to FIG. 12, the end of one row of cells 7 is electrically connected to the start of an adjacent row of cells 7 via a cross-connect element 61 in the form of a ribbon or a shim of a strip of metal.

Figure 7:
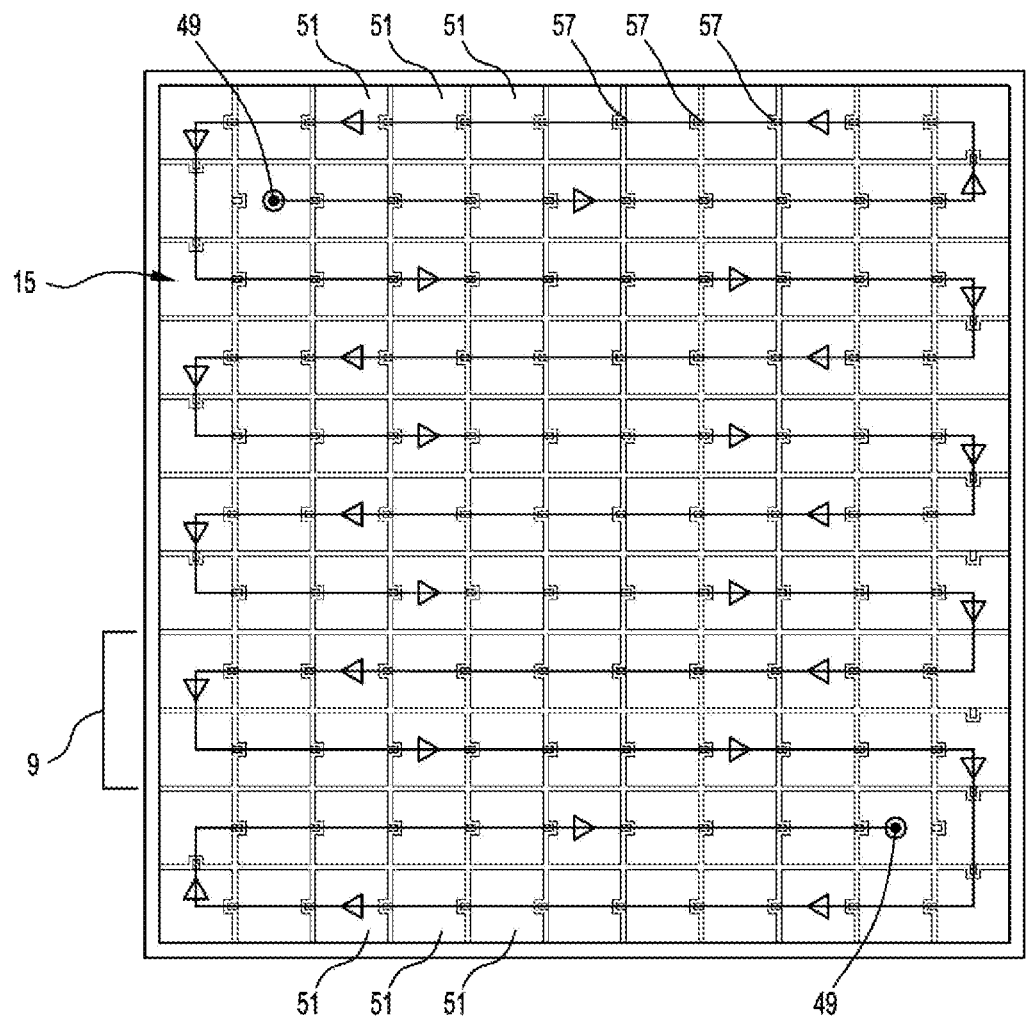
FIG. 7 is a top plan view of another embodiment of a photovoltaic cell assembly in accordance with the present invention with the top cover and the photovoltaic cells removed to reveal the layout of the upper metalized layer of the substrate of the assembly.

FIG. 7 is a top plan view of another embodiment of a photovoltaic cell assembly in accordance with the present invention with the top cover and the photovoltaic cells removed to reveal the layout of the upper metalized layer of the substrate of the assembly and additional features of the assembly, including connector terminals.

The FIG. 7 embodiment is substantially the same as the embodiment of the photovoltaic cell assembly shown in FIGS. 4 to 6 and 8 to 12.

The main difference between the embodiments is the arrangement of the series electrical circuits. In the FIG. 7 embodiment the series circuit runs from the terminal end of lead 49 near the top left corner of FIG. 7 along the row that includes the terminal end to the end of that row and across to the first cell in the adjacent row and along that row and so on until the series circuit reaches the terminal end of the lead 49 near the bottom right corner of the Figure. The series circuit is indicated by the arrowed line in the Figure.

Figure 13:
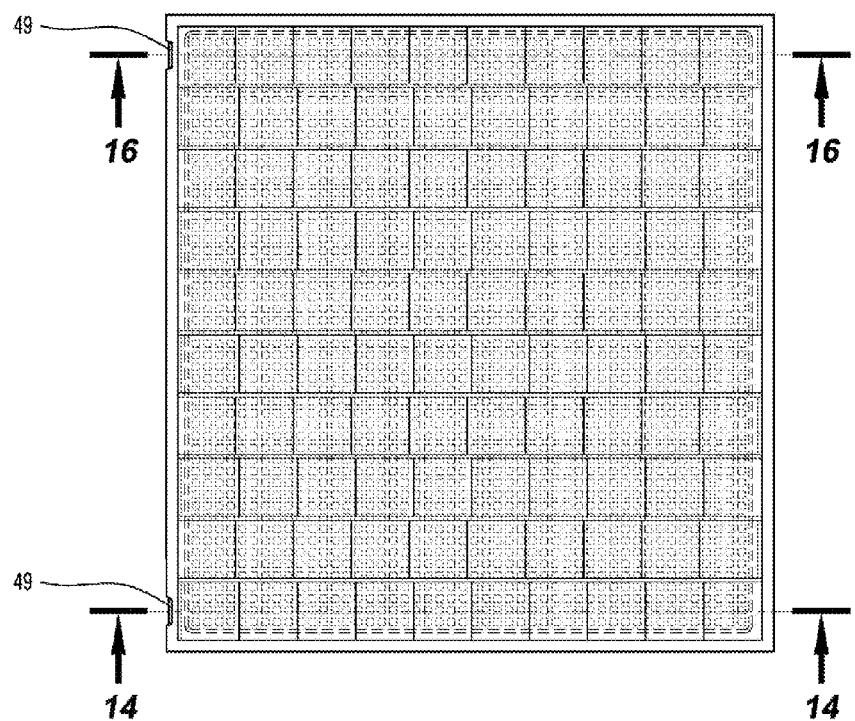
FIG. 13 is a top plan view of another embodiment of a dense array concentrated photovoltaic cell module in accordance with the present invention that is suitable for use in a receiver of a solar radiation-based electric power generating system, with the module including another embodiment of a photovoltaic cell assembly in accordance with the present invention.
Figure 14:
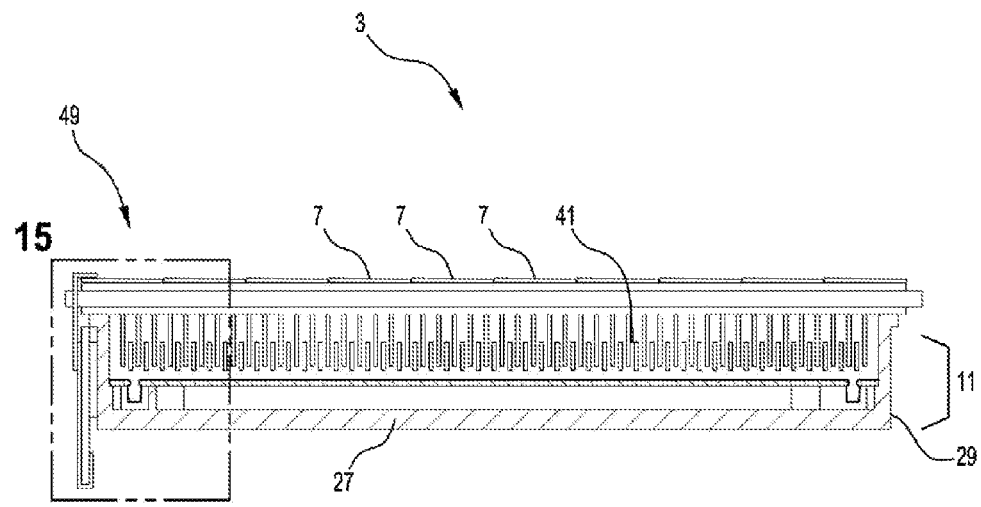
FIG. 14 is a cross-section along the line 14-14 in FIG. 13.
Figure 15:
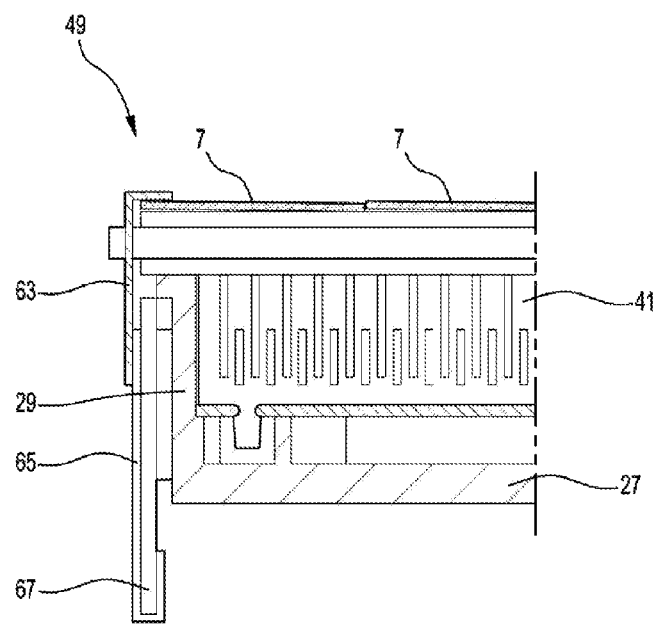
FIG. 15 is an enlargement of the rectangular box referred to as "Detail C" in FIG. 14.
Figure 16:
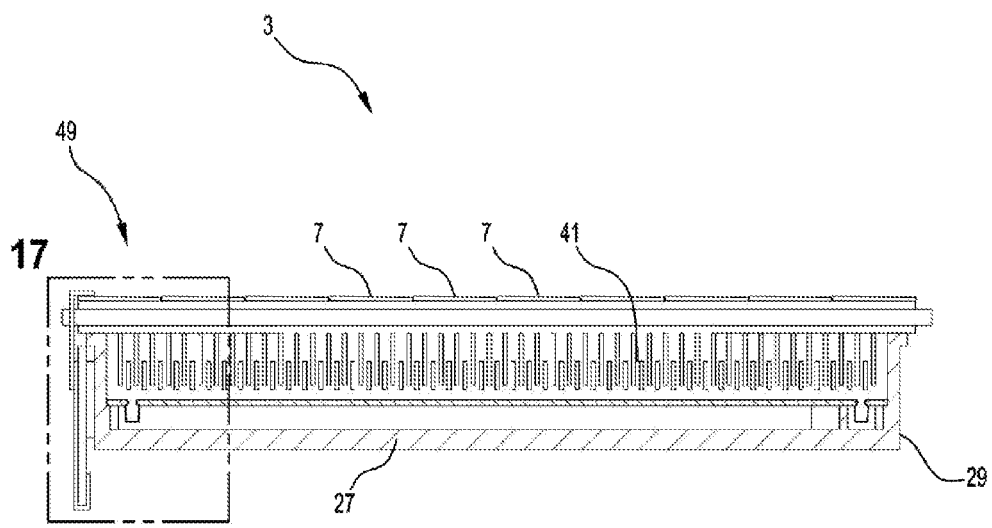
FIG. 16 is a cross-section along the line 16-16 in FIG. 13.
Figure 17:
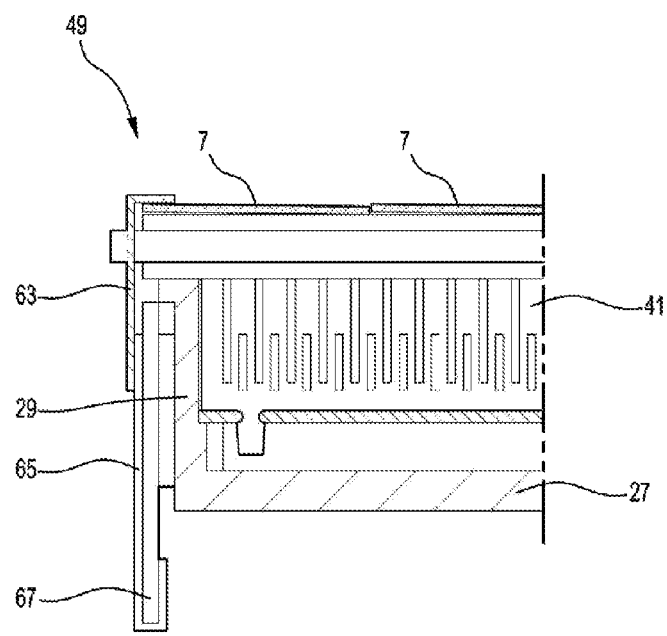
FIG. 17 is an enlargement of the rectangular box referred to as "Detail A" in FIG. 16.

FIGS. 13 to 17 illustrate another embodiment of a dense array concentrated photovoltaic cell module in accordance with the present invention that is suitable for use in a receiver of a solar radiation-based electric power generating system, with the module including another embodiment of a photovoltaic cell assembly in accordance with the present invention. FIG. 13 is a top plan view of the module. FIG. 13 looks through the module and shows the various components of the photovoltaic cell assembly of the module. This essentially transparent top plan view of the module shows the top cover 19, and the cells 7, the upper metalized layer 15 and additional components of the substrate and other components of the assembly, including connector terminals, and components of the heat extraction system 11, etc. FIGS. 14 to 17 show the assembly in more detail.

With reference to FIGS. 13 to 17, the photovoltaic cell assembly has the same basic components as the embodiments shown in FIG. 7 and in FIGS. 4 to 6 and 8 to 12. Specifically, the assembly includes a plurality of photovoltaic cells 7 mounted on a substrate, each cell 7 having an exposed surface for solar radiation. The cells 7 are arranged in a dense array that includes a string of cells which are electrically connected together and form a series electrical circuit. The cells 7 are arranged in a shingle, i.e. overlapping, pattern. The assembly also includes a by-pass diode associated with each cell 7 to allow the cell to be by-passed in the electrical circuit in the event that the cell fails or is under illuminated, and the diodes being positioned in the shadows of the cells.

The main difference between the embodiment shown in FIGS. 13 to 17 and the embodiments shown in FIG. 7 and in FIGS. 4 to 6 and 8 to 12 relates to the electrical circuit 49 that electrically connects the photovoltaic cell assembly to a busbar (not shown) of the receiver.

With reference to FIGS. 13 to 17, the electrical circuit 49 includes an L-shaped lead 63 that has (a) a short arm connected to a current input or a current output cell 7 of the photoelectric cell assembly and (b) a long arm that extends down the side 27 of the module. The electrical circuit 49 also includes a conductive member 65 that is electrically connected to the lead 63 that extends further down the side of the module and terminates in an in-turned hook section. The conductive member 65 is directly bonded or otherwise secured to an electrical isolator 67 that provides structural support for the assembly and electrically isolates the conductive member 65 and the lead 63 from the module. The up-turned end of the conductive member 65 is connected to a receiver bus-bar (not shown) that transfers current from the module to a receiver circuit.

One advantage of the embodiment is that the electrical circuit is separate from the heat extraction system 11. Specifically, unlike the embodiments shown in FIG. 7 and in FIGS. 4 to 6 and 8 to 12, the electrical circuit does not pass through the coolant chamber 41 of the heat extraction system 11.

FIG. 18 is a top plan view of another embodiment of a photovoltaic assembly in accordance with the present invention with the top cover and the photovoltaic cells removed to reveal the layout of the upper metalized layer of the substrate of the assembly. FIGS. 19 and FIG. 20 show the assembly in more detail.

The photovoltaic cell assembly is the same in a number respects as the other embodiments of the invention described in relation to FIGS. 4 to 17. Specifically, the assembly includes a plurality of photovoltaic cells 7 mounted on a substrate, each cell 7 having an exposed surface for solar radiation. The cells 7 are arranged in a dense array that includes a string of cells which are electrically connected together and form a series electrical circuit. The assembly also includes a by-pass diode 53 associated with each cell 7 to allow the cell 7 to be isolated from the electrical circuit in the event that the cell fails. The diodes 53 are positioned in the shadows of the cells 7.

The difference between the FIGS. 18 to 20 embodiment and the other embodiments is that the FIGS. 18 to 20 embodiment includes a Z-connect arrangement 69 that electrically interconnects successive cells 7 in a row and the cell 7 and the end of one row and the adjacent cell 7 and the start of another row, with the cells 7 being arranged in a flat arrangement of cells 7 (see FIG. 20) as opposed to the shingle arrangement of cells 7 of the other embodiments.

As can best be seen in FIG. 20, the Z-shaped connection 69 includes a pair of spaced-apart parallel arms 71, 73 and an interconnecting web 75, with the lower arm 73 of each connector being connected to an under surface of a leading end of one cell 7 and the upper arm 71 of each connector being connected to an upper surface of a trailing end of a successive cell 7. The diode 53 of the successive cell is located below the one cell and is connected to the lower arm of the connector. The assembly thereby connects successive cells 7 in series and simultaneously providing parallel connection to the diode with the successive cell, thereby protecting that cell.

One embodiment of a method of manufacturing a substrate for a shingle arrangement of the photovoltaic cell assembly 5 shown in FIGS. 4 and 6 to 10 includes the following steps.

Etching a piece of a metal-coated ceramic material to create the required gaps in the metal layer on one side of the piece, thereby leaving metal pads for mounting cells in a serpentine arrangement on that side of the piece.

Machining the surface of the metal pads to form metallised elements having a required sawtooth profile to mount cells (typically 100 microns high at one end and typically 400 microns high at the other end).

Completing the manufacture of the substrate by applying a constant thickness of solder (typically 50-100 microns), for example by screen printing, to the metallised elements. A constant thickness helps accuracy and repeatability of placement of cells onto the substrate and provides for known heat transfer across the cell—this is more of an issue for solder than for the metal because of the higher conductivity of the metal (typically a factor of 10 higher). Constant thickness makes assembly of the photovoltaic cell assembly 5 easier.

The photovoltaic cell assembly 5 may be assembled by positioning diodes, cross-connections, and cells on the substrate.

The photovoltaic cell assembly 5 of the present invention includes the following advantages and features:

The serpentine arrangement of lines of diodes and cross-connections avoids the need for wrap around cells—lowers component cost and simplifies manufacture.

The by-pass diodes have better thermal attachment—hence better heat transfer to the substrate also providing a heat path for cooling the cell above There is a large direct electrical connection between cells providing lower electrical resistance thus reducing losses and increasing output.

Each by-pass diode, by virtue of being sandwiched and bonded between a cell and the metalised substrate and positioned in the shadow of a neighbouring cell, requires no additional connections. One advantage is that each diode is intimately connected to a heat sink, i.e. there is a direct connection between each diode and the substrate. The metal on the substrate, typically copper, is thermally bonded to the highly conductive aluminium nitride (or other) substrate.

Bunching up of cells is possible with a shingle arrangement. This is an advantage to create space for electrical input and output terminals for power take-off from the module to a bus-bar or a neighbouring module. For example, there can be 10 cells in a row, bunched up 1 mm, with the output terminal being positioned in the 1 mm space. This means there is only 1% loss of effective area from 10 cells. The use of the high performance cells from a normal efficiency distribution typically occurring in cell manufacture allows this loss to be easily offset. No special cells are required. The entire module can assembled using just one type of low cost basic cell configuration.

The serpentine arrangement makes it possible to position electrical input and output terminals within a module perimeter. The perimeter of modules is an important issue from the perspective of waterproofness.

The serpentine arrangement makes it possible to minimise voltage between adjacent cells (or parts of a string) allowing closer cell packing improving module efficiency and reliability The module is sufficiently large in size to make it possible to use monitoring equipment in relation to each module. The monitoring equipment may be positioned on the back of a module. The monitoring equipment may measure voltage temperature and current and I-V characteristics at high speed for each module while the module is in operation.

The serpentine arrangement makes it possible to separate the electrical input and output terminals of the module and thereby minimise potential for short circuit between inlet and outlet.

The serpentine arrangement makes it possible to position the input and output terminals towards the perimeter of the cell and this is an advantage from an assembly viewpoint and from a serviceability viewpoint.

The large module size allows sufficient area for an effective edge seal (typically 0.5 to 1 mm thick) while causing minimal loss in ACAR A number of full scale shingle modules have been built and tested in the laboratory and 'on sun' under operational conditions.

The key features of the invention, namely to deliver low cost, high performance and reliability have been proven in work carried out by the applicant on the full scale shingle modules in the laboratory and 'on sun' under operational conditions.

These features include:

1. A simple practical build using low cost 'off the shelf' cells facilitated by the shingle substrate. The configuration allows for the inclusion of hidden protection by-pass diodes. The module can be manually assembled and is also suitable for robotic assembly at high speed using off the shelf robotic equipment (specially configured and programmed). To demonstrate these features five full scale modules were assembled and tested. A metallised substrate was formed, 100 solar cells and diodes were assembled into the configuration show in FIGS. 1 to 4 and 6 to 9. The production yield for all five modules was 100%. as shown by a flash test at 600 suns intensity and a diode continuity test. The tests produced typical results of; open cell voltage (Voc)=321 volts and maximum amperage (Isc)=8.4 amps. When compared to an individual cell Voc=3.21 volts and Isc=8.4 amps show a perfect result.

2. High "in module" cell efficiency due to high cell packing factor and maximised active area facilitated by the shingle design (and the hidden flat diodes mounted behind the cells). The five modules were subject to high intensity flash test at 600 suns. A high intensity flash simulator was specially configured to provide a short 5 millisecond burst of simulated sunlight at up to 600 suns intensity. A data acquisition system and load bank were synchronised to test the module under load at high intensity. The module active area efficiency was found to be the same as the cell active area, which in both cases was 37%. This proves there is no loss of cell efficiency as a result of the assembly into the module.

3. Circuit continuity and cell protection due to the diode arrangement within the shingle configuration, whereby intimate connection between the back of the cells is facilitated via large area diodes with excellent bonding to the cooled electrically conducting metallised substrate and the backside of the cells. The diodes were tested to 33 amps under forward bias; the maximum required for normal operation is 14 amps. The effectiveness of the diodes in preventing cell damage and providing current bypass for circuit continuity was demonstrated by exposing a module to high intensity sunlight of varied flux ranging from 600 to approximately 750 suns across the module causing simultaneous unequal illumination of the cells and further causing the diodes to operate in 'bypass' mode. Both the cells and diodes and cells were subsequently tested on the flash tester under repeated and controlled conditions. No failures were detected.

4. Low and controlled cell and diode temperature demonstrated due to a 3D contoured metallised substrate which facilitates intimate thermal connection to every part of every cell and one complete face of each diode. Cell and diode temperatures are below 70° C. at 800 suns intensity. The cell temperature was measured by Infrared thermometry. The diode integrity was tested after on sun exposure using reverse bias current which shows that all diodes are conducting. An open circuit flash test (Voc=321 volts) also confirmed that no diode had failed in short circuit.

5. High efficiency due to low series resistance facilitated by the shingle arrangement which connects each cell in a string directly to a neighbour without the use of connectors and requiring no 'dead space' to make the connection. The 'in module' efficiency for 100 cells in series is the same as the average of individual cell efficiencies. (or the total module power=sum of individual cell powers). An in-module cell efficiency was determined by flash test to be 37% using 100 individual cell of 37% (active area) efficiency.

6. The cell configuration was proven to be robust undergoing 13,000 temperature cycles with no significant degradation. The temperature range was typical of operational conditions being 28° C. to 65° C. with a resultant drop in (flash test) efficiency of less than 5% relative. (this power drop allowance is typical of IEC 6108 standards requirements) The module was mounted on a proprietary test rig which is designed to rapidly heat the module up to operating temperature and cool it down to the initial temperature approximately 1000 times per day. In this manner the module can be rapidly stressed to shown the effects of daily cycling equivalent to many years of operation.

7. The diode configuration was shown to be robust with no failures after 13,000 cycles from 28° C. to 65° C.

8. The cross connectors have been demonstrated to be robust showing no failures after 13,000 cycles from 28° C. to 65° C.

Many modifications may be made to the preferred embodiment described above without departing from the spirit and scope of the present invention.

By way of example, whilst the embodiment described above is described in the context of a large scale solar radiation-based electrical power generating system, the present invention is not so limited and extends to small scale systems such as roof-mounted systems for domestic or commercial electrical power generation.

In addition, whilst the solar radiation-based electric power generating system described above includes a parabolic array of mirrors, the present invention is not so limited and extends to other options, such as an array of heliostats, for reflecting and concentrating solar radiation onto a receiver.

The invention claimed is:

1. A dense array concentrated photovoltaic cell module that includes a plurality of the photovoltaic cell assemblies stacked together in side by side relationship in an array, with each photovoltaic cell assembly including:
   (i) a plurality of photovoltaic cells mounted on a substrate, each cell having a planar exposed upper surface for receiving solar radiation and a planar under surface connected to the substrate, the plurality of cells being electrically connected to form a circuit, the cells being arranged in a dense array covering more than 95% of the assembly,
   (ii) the substrate being a multiple layer substrate including an electrical insulation material layer, a top metalized layer, and a bottom metalized layer respectively on opposite top and bottom faces of the electrical insulation material layer, the top metalized layer comprising a plurality of mounting pads on which the cells are secured, with at least 90% of each cell being maintained in thermal contact with the substrate via the mounting pads, each mounting pad including a protruding section that extends under a neighboring cell;
   (iii) a bypass diode associated with a cell to allow that cell to be by-passed in the electrical circuit in the event that the cell fails or has low illumination; and
   (iv) a plurality of Z-shaped connectors electrically connecting together successive cells, each connector having a pair of spaced-apart parallel arms and an interconnecting web, with a lower arm of each connector being connected to an under surface of a second cell and to the bypass diode of a neighboring first cell via the protruding section of the mounting pad of the second cell, and with an upper arm of each connector being connected to an upper surface of the first cell, to thereby electrically connect the first and second cells in series and simultaneously providing a parallel connection between the first cell and its associated bypass diode;
   wherein the protruding section of the mounting pad of the second cell extends beneath the under surface of the first cell and the bypass diode of the first cell is located below the first cell and provides a thermal connection between the first cell and the substrate.

2. The module defined in claim 1 wherein one terminal of the bypass diode of the second cell is directly in contact electrically and thermally with the substrate and the other terminal of the bypass diode of the second cell is directly in contact electrically and thermally with the neighboring first cell.

3. The module defined in claim 1, wherein the protruding section is in the form of a tongue.

4. The module defined in claim 1 wherein the cells are soldered to the metallized elements.

5. The module defined in claim 1 wherein the substrate is an electrical insulator and a thermal conductor.

6. The module defined in claim 1 wherein the aspect ratio of the length or width to the height of each bypass diode is 5:1 to 10:1.

7. The module defined in claim 1 includes a monitoring circuit integrated into a back of the module for measuring voltage, current and temperature characteristics during operation.

8. A solar radiation-based electric power generating system that includes a solar radiation receiver for solar radiation and a solar radiation concentrator in the form of an array of mirrors that reflects and concentrates solar radiation that is incident on the mirrors towards the solar radiation receiver, with the solar radiation receiver including a plurality of the dense array concentrated photovoltaic cell modules defined in claim 1 stacked together in side by side relationship, wherein the module area is greater than 95% of the array area.

9. A dense array concentrated photovoltaic cell module that includes a plurality of photovoltaic cell assemblies stacked together in side by side relationship in an array, with each photovoltaic cell assembly including:
   (i) a plurality of photovoltaic cells mounted on a substrate, each cell having a planar exposed upper surface for receiving solar radiation and a planar under surface connected to the substrate, the plurality of cells being electrically connected to form a circuit, the cells being arranged in a dense array covering more than 95% of the assembly,
   (ii) the substrate being a multiple layer substrate including an electrical insulation material layer, a top metalized layer, and a bottom metalized layer respectively on opposite top and bottom faces of the electrical insulation material layer, the top metalized layer comprising a plurality of mounting pads on which the cells are secured, with at least 90% of each cell being maintained in thermal contact with the substrate via the mounting pads, each mounting pad including a protruding section that extends under a neighboring cell;
   (iii) a bypass diode associated with a cell to allow that cell to be by-passed in the electrical circuit in the event that the cell fails or has low illumination, the bypass diode being mounted on the protruding section of the mounting pad of that cell; and
   (iv) a plurality of Z-shaped connectors electrically connecting together successive cells, each connector having a pair of spaced-apart parallel arms and an interconnecting web, with a lower arm of each connector being connected to an under surface of a second cell and to the bypass diode of a neighboring first cell, and with an upper arm of each connector being connected to an upper surface of the first cell, to thereby electrically connect the first and second cells in series and simultaneously providing a parallel connection between the first cell and its associated bypass diode;

wherein the protruding section of the mounting pad of the first cell extends beneath the under surface of the second cell and the bypass diode of the first cell is located below the second cell and provides a thermal connection between the first cell and the substrate.

10. The module defined in claim 9 wherein one terminal of the bypass diode of the first cell is directly in contact electrically and thermally with the substrate and the other terminal of the bypass diode of the first cell is directly in contact electrically and thermally with the second cell.

11. A solar radiation-based electric power generating system that includes a solar radiation receiver for solar radiation and a solar radiation concentrator in the form of an array of mirrors that reflects and concentrates solar radiation that is incident on the mirrors towards the solar radiation receiver, with the solar radiation receiver including a plurality of the dense array concentrated photovoltaic cell modules defined in claim 9 stacked together in side by side relationship, wherein the module area is greater than 95% of the array area.

* * * * *